United States Patent [19]

Yoshida et al.

[11] Patent Number: 4,471,468

[45] Date of Patent: Sep. 11, 1984

[54] MAGNETIC BUBBLE MEMORY DEVICE

[75] Inventors: Kazutoshi Yoshida; Ryuji Yano, both of Mobara, Japan

[73] Assignee: Hitachi, Ltd., Tokyo, Japan

[21] Appl. No.: 520,855

[22] Filed: Aug. 5, 1983

[30] Foreign Application Priority Data

Aug. 9, 1982 [JP] Japan .............................. 57-137238

[51] Int. Cl.³ .......................................... G11C 19/08
[52] U.S. Cl. ........................................ 365/15; 365/1; 365/12
[58] Field of Search .......................... 365/1, 15, 16, 12

[56] References Cited

U.S. PATENT DOCUMENTS 4,259,727  3/1981  Orihara et al. ........................ 365/12

OTHER PUBLICATIONS

Electronics–Aug. 17, 1978; pp. 39 & 40.
Control Engineering–Jul. 1979; pp. 54–57.

Primary Examiner—James W. Moffitt
Attorney, Agent, or Firm—Charles E. Pfund

[57] ABSTRACT

A magnetic bubble memory device has a plurality of memory loops which comprise minor loops and a map loop arranged independently of the minor loops. The map loop stores index data and parameter data of the memory chip. By detecting the index data, parameter data addresses are designated, and required parameter data are read out and stored in parameter memories, respectively, so as to allow operation of magnetic bubble memory chips having different storage capacities and different parameters under control of a single control circuit.

2 Claims, 9 Drawing Figures

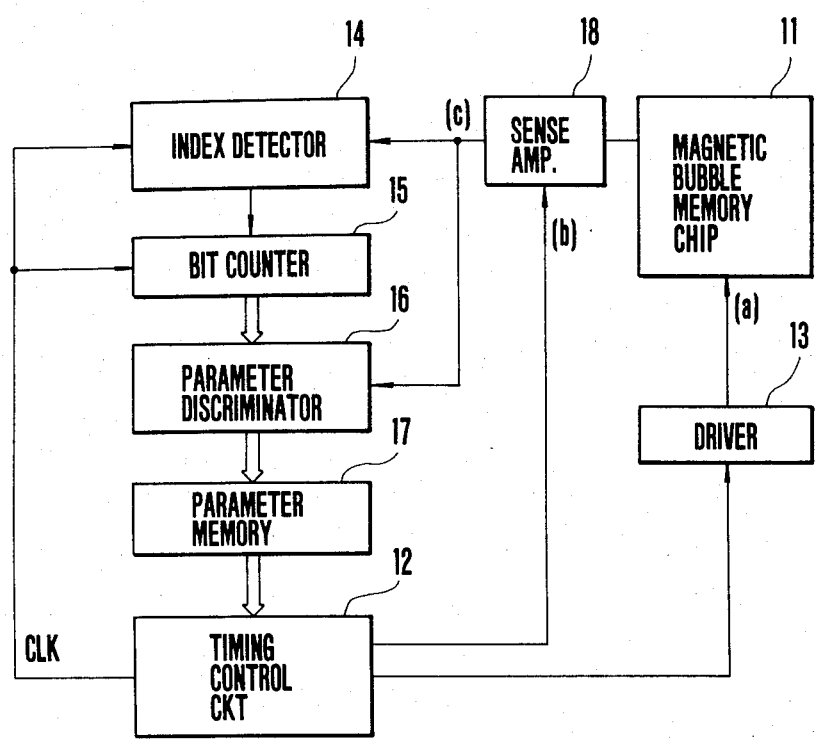
FIG.2
FIG.4a REPLICATOR PULSE
FIG.4b STROBE PULSE
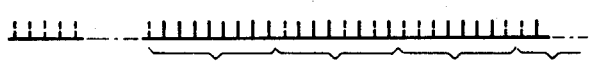
FIG.4c BUBBLE OUTPUT
FIG.4d INDEX DETECTION SIGNAL

MAGNETIC BUBBLE MEMORY DEVICE

BACKGROUND OF THE INVENTION

I. Field of the Invention

The present invention relates to a magnetic bubble memory device and, more particularly, to a magnetic bubble memory device having a control circuit suitable for controlling magnetic bubble memory chips having different storage capacities.

II. Description of the Prior Art

In general, a magnetic bubble memory is of a shift register type, and magnetic bubbles propagate bit by bit in synchronism with a rotating magnetic field whose flux rotates within the plane of the magnetic bubble memory chip. The bubble memory chip generally has a major-minor loop system and has various functions such as a function for generating a magnetic bubble, a replicator function for replicating the magnetic bubble, a transfer-in gate function for transferring the magnetic bubble from a major loop to a minor loop, a transfer-out gate function for transferring the magnetic bubble from the minor loop to the major loop, and a detector function for detecting the magnetic bubble. Since the magnetic bubble memory chip having the above functions is operated to propagate the magnetic bubble in synchronism with the rotating magnetic field, operating parameters for these functions are required.

FIG. 1 is an enlarged plan view showing the main part of a conventional major-minor loop type magnetic bubble memory chip having write and read lines. Referring to FIG. 1, reference numeral 1 denotes a set of minor loops for a magnetic bubble memory; 2, a write line of the magnetic bubble; and 3, a read line thereof. A generator 4 generates a magnetic bubble on the write line 2. A transfer-in gate 5 transfers the magnetic bubble written on the write line 2 to the minor loop 1. A replicator/transfer-out gate 6 transfers the magnetic bubble on a minor loop 1 to the read line 3, and divides the magnetic bubble and returns a divided part to the minor loop 1. A detector 7 detects the magnetic bubble.

The following parameters are required to operate the magnetic bubble memory chip having the construction described above: a bit number parameter m indicating the number of bits in each minor loop 1; a minor loop number parameter; a bit number parameter $n_1$ indicating the number of bits ranging from the generator 4 to the transfer-in gate 5; a bit number parameter $n_2$ indicating the number of bits ranging from the replicator/transfer-out gate 6 to the detector 7; and a bit number parameter $n_3$ indicating the number of bits ranging from the replicator/transfer-out gate 6 to the transfer-in gate 5.

In the conventional magnetic bubble memory device of the type described above, these parameter data are set in a control circuit (not shown). These data are used to control generation of pulse signals required for the various functions, and hence to control the magnetic bubble memory chip.

However, these parameters are given at the time of magnetic bubble memory chip design. For this reason, conventional magnetic bubble memory chips having different storage capacities cannot be controlled by a single control circuit. In order to control a magnetic bubble memory chip having a different storage capacity, a separate parameter setting circuit is required. Demands have arisen for interchangeably using bubble memory chips having different capacities in a single memory. The conventional magnetic bubble memory devices, however, cannot satisfy these demands.

SUMMARY OF THE INVENTION

The present invention has been made in consideration of the above conventional drawback and has for its object to provide a magnetic bubble memory device having a control circuit for controlling magnetic bubble memory chips having different storage capacities for interchangeable use of the chips.

Another object of this invention is to specify the construction of the control circuit.

In order to achieve the above objects of the present invention, there is provided a magnetic bubble memory device comprising:

a magnetic bubble memory chip having a plurality of memory loops constituted by minor loops and a map loop independent from the minor loops such that the map loop has a map loop replicator operative independently of a minor loop replicator of the minor loops, the map loop being adapted to store parameter data and index bit data of the memory chip;

a timing control circuit for generating timing signals to enable various types of functions of the magnetic bubble memory chip;

a driver for setting the magnetic bubble memory chip in the various types of functions in accordance with the timing signals from the timing control circuit, respectively;

an index detector for detecting the index data of the parameter data stored in the map loop of the magnetic bubble memory chip;

a bit counter for operating the magnetic bubble memory chip in response to an output from the index detector;

a parameter discriminator for discriminating a parameter address of the magnetic bubble memory chip in accordance with an output from the bit counter; and parameter memory means for storing discriminated parameter data and setting storage signals in the timing control circuit;

whereby the data are continuously read out from the map loop so as to discriminate the parameter address, parameter address data is then set in the bit counter, necessary parameter data to operate the magnetic bubble memory chip are read out by using the parameter address as a reference, and the necessary parameter data are set in the timing control circuit.

According to the present invention, the parameters of the magnetic bubble memory chip are not preset in the control circuit, but are set therein in accordance with a storage capacity of a given magnetic bubble memory. Parameters are prestored in the magnetic bubble memory and are read out from an independently operated map loop before the magnetic bubble memory is operated, thereby setting the parameters in the control circuit. Therefore, even if a magnetic bubble memory having a given storage capacity is replaced with another memory having a storage capacity differing from the given storage capacity, the magnetic bubble memory device as a whole can be properly operated.

BRIEF DESCRIPTION OF THE DRAWINGS

FIG. 2 is a block diagram of a magnetic bubble memory system according to an embodiment of the present invention;

FIGS. 4a to 4d are timing charts for explaining readout of parameter data;

DETAILED DESCRIPTION OF THE PREFERRED EMBODIMENT

Figure 1:
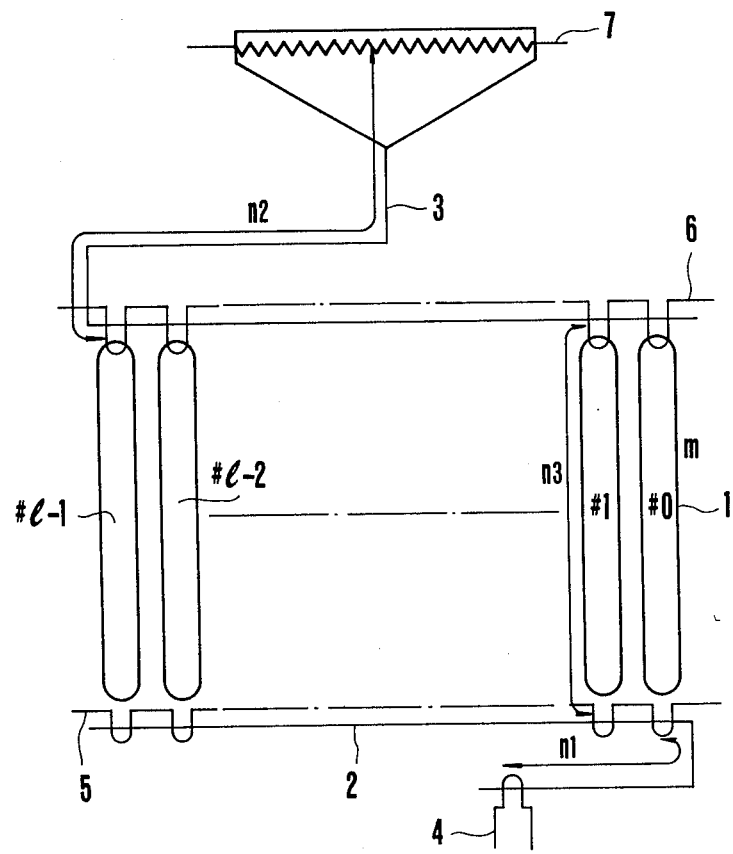
FIG. 1 an enlarged plan view showing the main part of a conventional magnetic bubble memory chip.

An embodiment of the present invention will be described with reference to the accompanying drawings. It is noted that a detailed circuit will be illustrated and described only for the purpose of easy understanding.

FIG. 2 shows a basic circuit arrangement for explaining a magnetic bubble memory device according to the embodiment of the present invention. Reference numeral 11 denotes a magnetic bubble memory chip. A timing control circuit 12 generates timing signals for setting the magnetic bubble memory chip 11 at various functions. A driver 13 generates a predetermined pulse current and a drive current for generating a rotating magnetic field in response to the timing signals from the timing control circuit 12. An index detector 14 detects an index of the magnetic bubble memory chip 11 so as to read out a proper parameter therefrom. A bit counter 15 can be started in response to an index signal from the index detector 14. A parameter discriminator 16 checks in accordance with the counter data an address of the chip 11 at which desired parameter data is stored. A parameter memory 17 stores data for the magnetic bubble memory chip 11. A sense amplifier 18 is connected to the magnetic bubble memory chip 11, the timing control circuit 12, the index detector 14, and the parameter discriminator 16. The sense amplifier 18 receives and amplifies data from the magnetic bubble memory chip 11 in response to a strobe signal from the timing control circuit 12 and effects discrimination between "1" and "0". The "1" or "0" data is then supplied to the index detector 14 and the parameter memory 17.

In the magnetic bubble memory device having the construction described above, the timing control circuit 12 supplies necessary timing signals to the driver 13. The driver 13 generates a pulse current, a drive current for the rotating magnetic field and so on to operate the magnetic bubble memory chip 11. Necessary parameters are read out from the magnetic bubble memory chip 11 to the index detector 14. When an index signal is detected, the bit counter 15 is started to identify addresses of the magnetic bubble memory chip 11 at which the parameters are stored. The parameter discriminator 16 checks the addresses of the parameter data in accordance with the count data from the bit counter 15. Parameter data at these addresses are read out from the magnetic bubble memory chip 11 to the parameter memory 17. The timing control circuit 12 controls the magnetic bubble memory chip 11 in accordance with these parameters.

Figure 3:
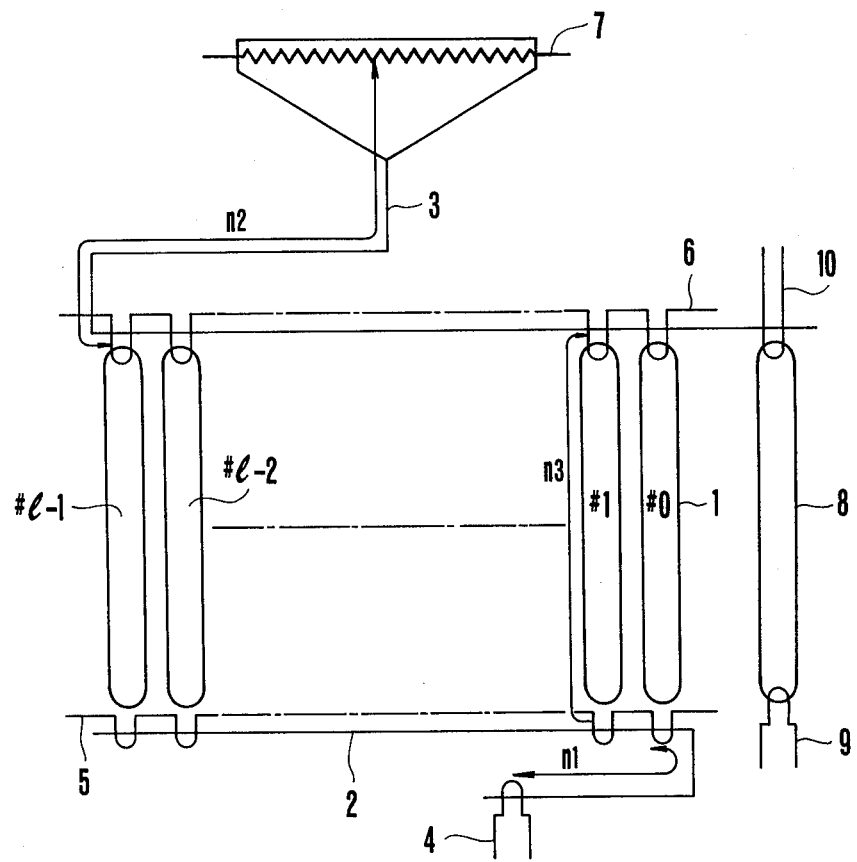
FIG. 3 is an enlarged plan view showing the magnetic bubble memory chip shown in FIG. 2 and a parameter storage loop thereof.

FIG. 3 is an enlarged plan view showing the main part of the magnetic bubble memory chip 11 having a special loop for storing the parameter data. Unlike the conventional magnetic bubble memory chip shown in FIG. 1, the chip 11 shown in FIG. 3 has a map loop 8 for storing index data and parameter data of the magnetic bubble memory chip 11. The map loop 8 is arranged independently of the minor loops 1 for storing read/write data. The term "independently" is defined to mean that the map loop 8 is associated with a replicator *independent* of the replicator of the minor loops 1. A map loop generator 9 serves to write data in the map loop 8. A map loop replicator 10 serves to divide data of the map loop 8 and read out a divided part to a read line 3. In this case, the map loop 8 stores index data indicating address 0 of the minor loops and parameter data of the magnetic bubble memory chip 11 in a given format following the index bit data.

The read operation associated with the data in the map loop 8 will be described in detail with reference to FIGS. 4a to 4d. FIGS. 4a to 4d are timing charts showing the replicator pulses from the map loop replicator 10, the strobe pulses from the timing control circuit 12, the bubble output from the map loop 8 detected by the detector 7, and the index detector output, respectively. These signals appear in FIG. 2 as indicated by (a), (b) and (c). In the magnetic bubble memory chip 11 shown in FIG. 3, in order to read out data (FIGS. 4a and 4c) from the map loop 8, replicator pulses shown in FIG. 4a are successively supplied to the magnetic bubble memory chip 11, and the magnetic bubbles written in the map loop 8 are successively transferred to the read line 3. At the same time, the strobe pulses (FIG. 4b) are successively supplied from the timing control circuit 12 to the sense amplifier 18. In this case, a predetermined number of bits is required to propagate the magnetic bubble from the map loop replicator 10 to the detector 7. Therefore, the detector 7 generates the index detector output of level "0" until the first or heading data reaches the detector 7, while the replicator pulses are successively supplied to the map loop replicator 10. Referring to FIG. 4c, an output illustrated by a solid line indicates an output signal of level "1" (presence of a bubble), and an output illustrated by a dotted line indicates an output signal of level "0" (absence of a bubble). When a predetermined time interval has elapsed and the data from the map loop 8 has reached the detector 7, the detector 7 starts detecting the data from the map loop 8.

On the other hand, the map loop 8 stores the index data and parameter data of the magnetic bubble memory chip in the following format. The index bit data comprises 8-bit data whose bits are all set at level "1". The lowermost bit level "1" indicates address 0. The parameter data follow the index bit data, and each parameter data comprises 8-bit data having a corresponding address. In the case shown in FIG. 4c, only 7 bits are used as each parameter data, and the uppermost one bit is always set at level "0". For example, a parameter $n_1$ is set at "01110101", and a parameter $n_2$ is set at "00011110". Therefore, all the bits of each parameter data may not be set at level "1", so that the parameter data can be clearly distinguished from the index bit data.

The index detector 14 (FIG. 2) generates the index detector output when it detects the index bit data all of whose bits are set at level "1". The bit counter 15 is reset in response to the index detector output. Therefore, a desired number of parameter data can be written following the index bit data. However, the data must be assigned to predetermined bit positions, respectively, even if a magnetic bubble memory chip having a different storage capacity is used. For example, the first 8-bit data is assigned to the parameter $n_1$, the next 8-bit data is assigned to the parameter $n_2$, and so on. Otherwise, the timing cannot be controlled in practice.

Figure 5:
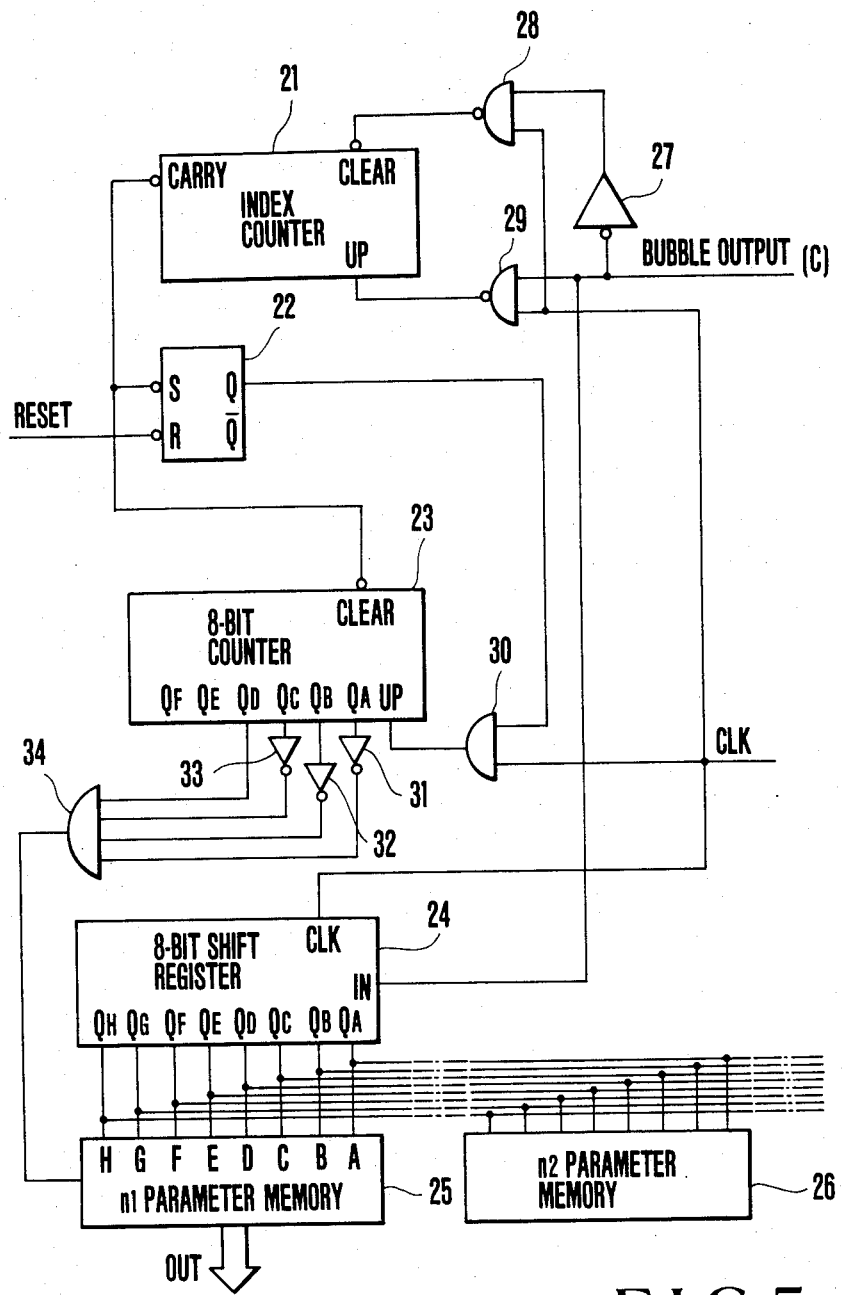
FIG. 5 is a block diagram of a parameter reader.

FIG. 5 is a block diagram of a circuit for reading parameters described above. Reference numeral 21 denotes an index counter. The index counter 21 is reset when it receives a signal of level "L" at its CLEAR terminal. The count of the counter 21 is reset to zero. When a signal of level "H" is supplied to the UP terminal of the index counter 21, the counter 21 counts up by one. When the count has reached a maximum value (8 in this embodiment), the index counter 21 generates a CARRY signal. A flip-flop 22 is set in response to the CARRY signal. Reference numeral 23 denotes an 8-bit counter; and 24, an 8-bit shift register. The IN terminal of the shift register 24 receives the magnetic bubble output. The shift register 24 is shifted by one bit in response to a CLK signal supplied thereto. A parameter memory 25 stores parameters $n_1$, and a parameter memory 26 stores parameters $n_2$. An inverter 27 receives the magnetic bubble output. A NAND gate 28 receives the CLK signal and an inverted signal from the inverter 27. A NAND gate 29 receives the CLK signal and the magnetic bubble output. An AND gate 30 receives the CLK signal and the Q output from the flip-flop 22. Inverters 31, 32 and 33 receive outputs from the counter 23. An AND gate 34 receives outputs from the inverters 31, 32 and 33 and the counter 23.

In the circuit having the arrangement described above, the index counter 21 receives a NAND-ed signal from the NAND gate 29 which receives the bubble output and the CLK signal. The index counter 21 counts the bubble output of level "1" in synchronism with the CLK signal. The CLEAR terminal of the index counter 21 receives the output inverted by the inverter 27 (i.e., a NAND-ed output of the bubble output of level "0" and the CLK signal). When the bubble output is set at level "0", the counter 21 is reset. Therefore, when the count of the counter 21 has reached eight (i.e., when eight bits of level "1" have been successively supplied to the counter 21), the counter 21 generates a CARRY signal, thereby detecting the index signal. The CARRY signal corresponds to the index detector signal in FIG. 4d. The bit counter 23 is then reset in response to the CARRY signal. At the same time, the flip-flop 22 is reset. The Q output signal from the flip-flop 22 is AND-ed with the CLK signal by the AND gate 30. When the flip-flop 22 is set, the CLK signal is supplied to the bit counter 23. The bit counter 23 counts up in response to the CLK signal. In this case, the flip-flop 22 must be reset in advance in response to a RESET signal. When the bit counter 23 starts counting and its count has reached eight, the AND gate 34 generates a signal. The inverters 31, 32 and 33 and the AND gate 34 constitute a decoder for checking that the count has reached eight. Under this condition, outputs $Q_A$, $Q_B$, $Q_C$ and $Q_D$ from the bit counter 23 are set at "0", "0", "0" and "1", respectively. When the outputs $Q_A$, $Q_B$, and $Q_C$ are inverted by the inverters 31, 32 and 33, respectively, all the inverted signals are set at level "1". Inputs to the AND gate 34 are set at level "1" when the count of the counter 23 is eight. Therefore, the AND gate 34 generates a signal of level "1". In response to this signal, the storage content of the shift register 24 is written in the parameter memory 25. The bubble outputs are sequentially supplied to the shift register 24. The contents of the shift register 24 are always updated (i.e., 8-bit updated bubble output data). The parameter memory 25 stores the parameter $n_1$. In the same manner as described above, every time the count of the counter 23 has reached eight, the bit counter 23 generates a signal so as to store the parameters $n_2, n_3, \ldots$, in the corresponding memories.

In the arrangement described above, the map loop replicator pulses are successively supplied irrespective of the parameters of the magnetic bubble memory chip, and the strobe signal is supplied to the detector through the sense amplifier, so that the parameters can be properly preset. Even if a magnetic bubble memory chip having different parameters is used, the parameters can be properly read out and preset. Therefore, a single control circuit can control magnetic bubble memory chips having different storage capacities and storing different parameters.

Figure 6:
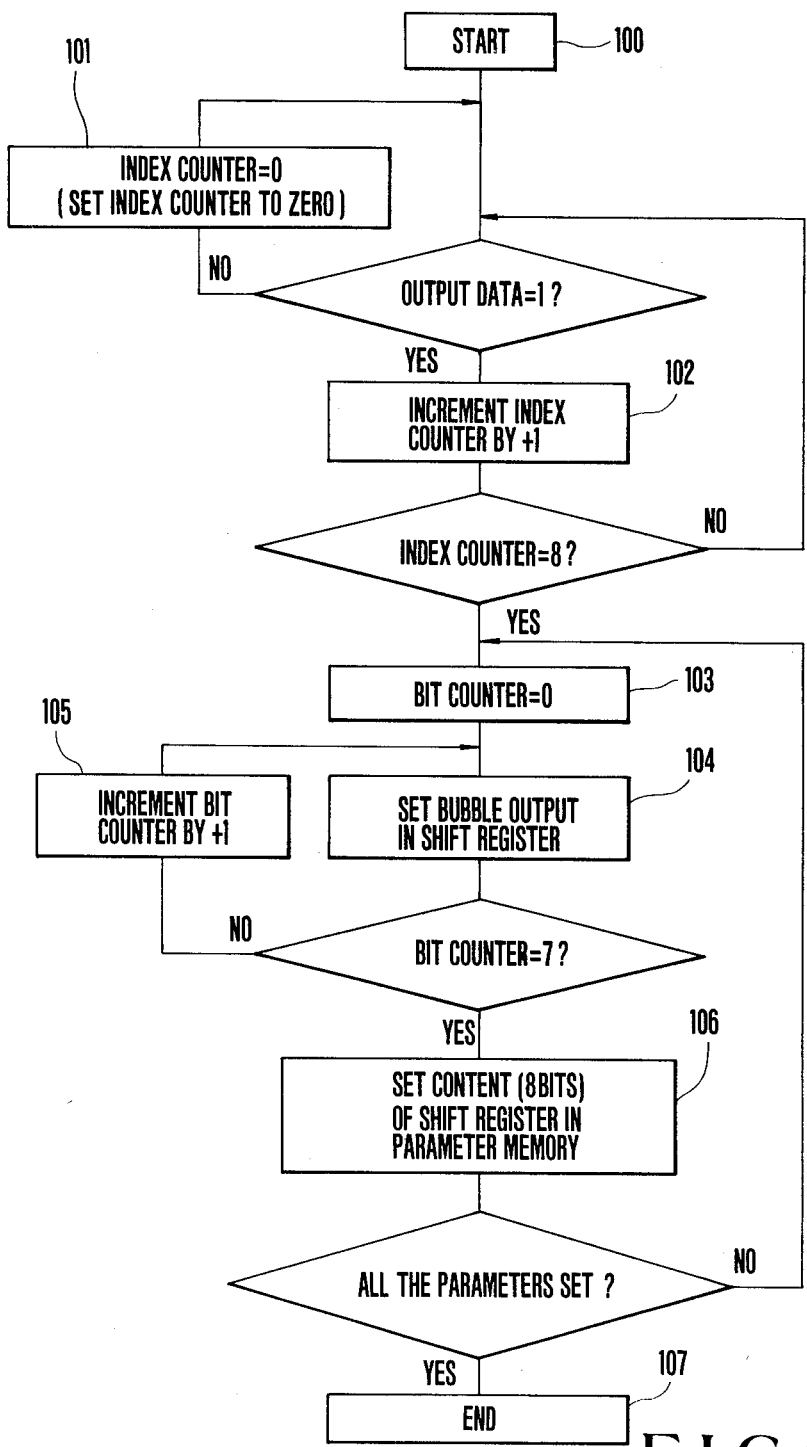
FIG. 6 is a flow chart for explaining a readout operation of a parameter performed using programming.

The readout and preset operations of the parameters can be performed by programming (FIG. 6) instead of hardware (FIG. 5). FIG. 6 is a flow chart showing the steps of operations. Referring to FIG. 6, in step 100, the magnetic bubble memory chip is started. The output from the magnetic bubble memory chip is checked; if the output data is set at level "0", the index counter is set as "0" in step 101. When the output data is set at level "1", the count of the index counter is incremented by one in step 102. The above operation is repeated until the count of the index counter has reached eight (i.e., eight signals of level "1" are consecutively supplied to the index counter). When the count of the index counter has reached eight, the output from the magnetic buble memory chip is set in the shift register 24 in step 104. It is then checked whether or not the count of the bit counter 15 has reached seven. If NO, the count of the bit counter 15 is incremented by one in step 105, and the bubble output is set in the shift register 24. The above operation is repeated until the count of the bit counter 15 has reached seven. When the count of the bit counter 15 has reached seven, the content (8-bit data) of the shift register 24 is stored in the parameter memory in step 106. Subsequently, the above operation is repeated for the required number of parameters $n_1, n_2, \ldots$ Thereafter, the routine is ended in step 107.

According to the embodiment of the present invention as described above, magnetic bubble memory chips storing different parameter can be interchangeably used under a single control device. Therefore, even if the storage capacity is increased to 256 kb, 1 Mb, 4 Mb, ..., the memory chip can be easily controlled, resulting in a variety of industrial applications.

What is claimed is:

1. A magnetic bubble memory device comprising:
   a magnetic bubble memory chip having a plurality of memory loops constituted by minor loops and a map loop independent from said minor loops such that said map loop has a map loop replicator operative independently of a minor loop replicator of said minor loops, said map loop being adapted to store parameter data and index bit data of said memory chip;
   a timing control circuit for generating timing signals to enable various types of functions of said magnetic bubble memory chip;
   a driver for setting said magnetic bubble memory chip in the various types of functions in accordance with the timing signals from said timing control circuit, respectively;
   an index detector for detecting the index data of the parameter data stored in said map loop of said magnetic bubble memory chip;
   a bit counter for operating said magnetic bubble memory chip in response to an output from said index detector;

a parameter discriminator for discriminating a parameter address of said magnetic bubble memory chip in accordance with an output from said bit counter; and parameter memory means for storing discriminated parameter data and setting storage signals in said timing control circuity;

whereby the data are continuously read out from said map loop so as to discriminate the parameter address, parameter address data is then set in said bit counter, necessary parameter data to operate said magnetic bubble memory chip are read out by using the parameter address as a reference, and the necessary parameter data are set in said timing control circuit.

2. A device according to claim 1, wherein the parametr data consists of a first parameter indicating the number of bits in the minor loop, a second parameter indicating the number of minor loops, a third parameter indicating the number of bits corresponding to a distance between a bubble generator and a transfer-in gate, a fourth parameter indicating the number of bits corresponding to a distance between said minor loop replicator and a bubble detector, and a fifth parameter indicating the number of bits between said minor loop replicator and said transfer-in gate.

* * * * *